(12) United States Patent
Rozenblit et al.

(10) Patent No.: US 7,515,880 B2
(45) Date of Patent: Apr. 7, 2009

(54) VARIABLE GAIN FREQUENCY MULTIPLIER

(75) Inventors: Dmitriy Rozenblit, Irvine, CA (US); Rajasekhar Pullela, Colton, CA (US); Tirdad Sowlati, Irvine, CA (US); Shahrzad Tadjpour, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 418 days.

(21) Appl. No.: 11/348,001

(22) Filed: Feb. 6, 2006

(65) Prior Publication Data
US 2007/0072556 A1 Mar. 29, 2007

Related U.S. Application Data

(63) Continuation-in-part of application No. 11/235,907, filed on Sep. 27, 2005.

(51) Int. Cl.
*H04B 1/38* (2006.01)

(52) U.S. Cl. .................. 455/73; 455/78; 455/118; 455/127.1; 455/76; 455/88; 455/180.3; 455/69; 327/93; 327/143; 330/129; 330/140; 330/85

(58) Field of Classification Search ............ 455/73, 455/76, 78, 313, 316, 234.1, 522, 323, 326, 455/169.1, 88; 327/93, 143; 375/139
See application file for complete search history.

(56) References Cited

U.S. PATENT DOCUMENTS

| | | | | |
|---|---|---|---|---|
| 5,631,921 A | * | 5/1997 | Schilling | 375/130 |
| 5,835,527 A | * | 11/1998 | Lomp | 375/142 |
| 5,890,051 A | * | 3/1999 | Schlang et al. | 455/76 |
| 5,896,562 A | * | 4/1999 | Heinonen | 455/76 |
| 5,920,590 A | * | 7/1999 | Lomp | 375/146 |
| 5,963,583 A | * | 10/1999 | Davidovici et al. | 375/130 |
| 5,995,538 A | * | 11/1999 | Lomp | 375/142 |
| 6,002,925 A | * | 12/1999 | Vu et al. | 455/313 |
| 6,112,061 A | * | 8/2000 | Rapeli | 455/83 |
| 6,175,586 B1 | * | 1/2001 | Lomp | 375/130 |
| 6,208,844 B1 | * | 3/2001 | Abdelgany | 455/82 |
| 6,226,316 B1 | * | 5/2001 | Schilling et al. | 375/142 |
| 6,591,090 B1 | | 7/2003 | Vuorio et al. | |
| 7,058,364 B2 | * | 6/2006 | Atkinson et al. | 455/76 |
| 7,099,636 B2 | * | 8/2006 | Rozenblit et al. | 455/126 |
| 7,123,664 B2 | * | 10/2006 | Matero | 375/295 |
| 7,242,912 B2 | * | 7/2007 | Maligeorgos et al. | 455/88 |
| 7,266,352 B2 | * | 9/2007 | Soe et al. | 455/209 |
| 7,356,310 B2 | * | 4/2008 | Rofougaran et al. | 455/66.1 |
| 2004/0109514 A1 | | 6/2004 | Magoon et al. | |
| 2005/0176388 A1 | | 8/2005 | Yamawaki et al. | |

* cited by examiner

*Primary Examiner*—Marceau Milord

(57) ABSTRACT

A variable gain frequency multiplier comprises a multiplier circuit and a control circuit configured to receive a power control signal, the power control signal being proportional to a power output signal.

17 Claims, 8 Drawing Sheets

VARIABLE GAIN FREQUENCY MULTIPLIER

CROSS REFERENCE TO RELATED APPLICATION

This application is a continuation-in-part of U.S. patent application Ser. No. 11/235,907, entitled "Single chip GSM/EDGE Transceiver Architecture With Closed Loop Power Control," filed on Sep. 27, 2005, the entire disclosure of which is incorporated herein by reference.

BACKGROUND

Radio frequency (RF) transmitters are found in many one-way and two-way communication devices, such as portable communication devices, (cellular telephones), personal digital assistants (PDAs) and other communication devices. An RF transmitter must transmit using whatever communication methodology is dictated by the particular communication system within which it is operating. For example, communication methodologies typically include amplitude modulation, frequency modulation, phase modulation, or a combination of these. In a typical global system for mobile communications (GSM) mobile communication system using narrowband TDMA technology, a Gaussian minimum shift keying (GMSK) modulation scheme supplies a clean phase modulated (PM) transmit signal to a non-linear power amplifier directly from an oscillator.

In such an arrangement, a non-linear power amplifier, which is highly efficient, can be used, thus allowing efficient transmission of the phase-modulated signal and minimizing power consumption. Because the modulated signal is supplied directly from an oscillator, the need for filtering, either before or after the power amplifier, is minimized. Other transmission standards, such as that employed in IS-136, however, use a modulation scheme in which the transmitted signal is both phase modulated (PM) and amplitude modulated (AM). Standards such as these increase the data rate without increasing the bandwidth of the transmitted signal. Unfortunately, existing GSM transmitter hardware is not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is further complicated because transmitters typically employed in GSM communication systems transmit in bursts and must be able to control the ramp-up of the transmit power as well as have a high degree of control over the output power level over a wide power range. In GSM this power control is typically performed using a closed feedback loop in which a portion of the signal output from the power amplifier is compared with a reference signal and the resulting error signal is fed back to the control port of the power amplifier.

The EDGE communication system attempts to increase the data transmission capability of a GSM communication system by including an amplitude modulation (AM) component in the transmit signal. However, when attempting to add an AM component to the GSM type modulation system, the power control loop will attenuate the amplitude variations present in the signal in an attempt to maintain a constant output power. In such an arrangement, the power control loop tends to cancel the AM portion of the signal.

Further, in those transmission standards in which both a PM signal and an AM signal are sent to a power amplifier, unless the power amplifier is very linear, it may distort the combined transmission signal by causing undesirable AM to PM conversion.

This conversion is detrimental to the transmit signal and can require the use of a costly and inefficient linear power amplifier.

In the past, the transceiver components for such a communication system were typically implemented using multiple devices, also referred to as "chips." However, industry pressures to reduce cost, implementation complexity and power consumption and to extend battery life are driving the industry to attempt single chip architectures.

Unfortunately, a single chip implementation for a GSM/EDGE transceiver presents many design challenges, especially in a system in which a closed power control loop is used to control output power of the transmitter. For example, when a closed loop power control system is implemented on the same chip as the transceiver components, the radio frequency (RF) on-chip isolation requirement between the components becomes a major factor affecting transceiver performance.

SUMMARY

A variable gain frequency multiplier comprises a multiplier circuit and a control circuit configured to receive a power control signal, the power control signal being proportional to a power output signal.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures.

The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the variable gain frequency multiplier can be implemented in any system where it is desirable to have a single chip GSM/EDGE transceiver.

The variable gain frequency multiplier can be implemented in hardware, software, or a combination of hardware and software. When implemented in hardware, the variable gain frequency multiplier can be implemented using specialized hardware elements and logic. When the variable gain frequency multiplier is implemented partially in software, the software portion can be used to precisely control the various components in the variable gain frequency multiplier. The software can be stored in a memory and executed by a suitable instruction execution system (microprocessor). The hardware implementation of the variable gain frequency multiplier can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the variable gain frequency multiplier comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

Figure 1:
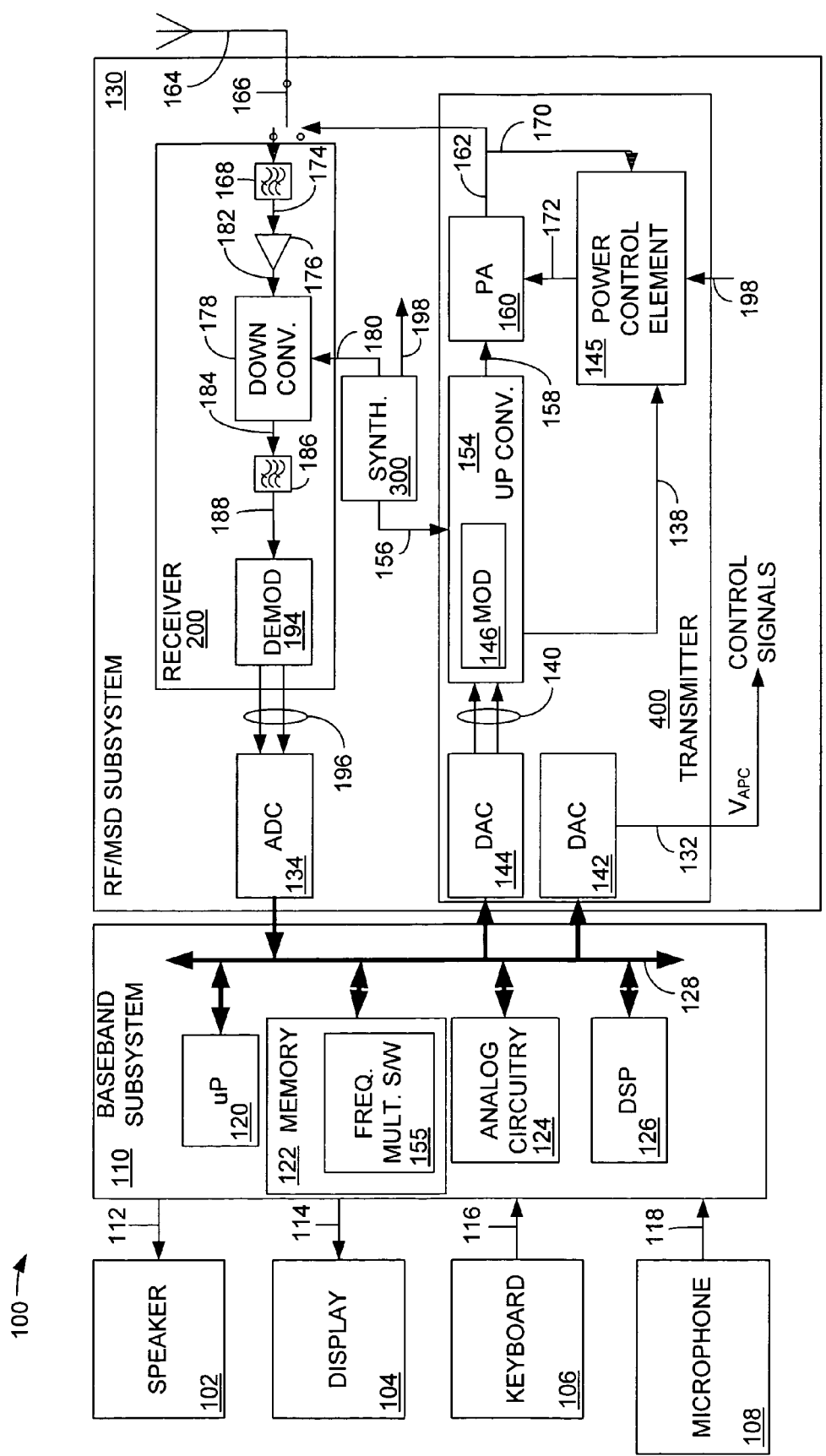
FIG. 1 is a block diagram illustrating a simplified portable transceiver.

FIG. 1 is a block diagram illustrating a simplified portable transceiver 100. The portable transceiver 100 includes speaker 102, display 104, keyboard 106, and microphone 108, all connected to baseband subsystem 110. In a particular embodiment, the portable transceiver 100 can be, for example but not limited to, a portable telecommunication handset such as a mobile cellular-type telephone. The speaker 102 and the display 104 receive signals from the baseband subsystem 110 via connections 112 and 114, respectively, as known to those skilled in the art. Similarly, the keyboard 106 and the microphone 108 supply signals to the baseband subsystem 110 via connections 116 and 118, respectively. The baseband subsystem 110 includes microprocessor (μP) 120, memory 122, analog circuitry 124, and digital signal processor (DSP) 126 in communication via bus 128. The bus 128, though shown as a single connection, may be implemented using a number of busses connected as necessary among the subsystems within baseband subsystem 110. The microprocessor 120 and the memory 122 provide the signal timing, processing and storage functions for the portable transceiver 100. If portions of the variable gain frequency multiplier are implemented in software, then the memory 122 also includes variable gain frequency multiplier software 155 that can be executed by the microprocessor 120, the DSP 126 or by another processor.

The analog circuitry 124 provides the analog processing functions for the signals within the baseband subsystem 110. The baseband subsystem 110 communicates with the radio frequency (RF)/mixed signal device (MSD) subsystem 130 via the bus 128.

The RF/MSD subsystem 130 includes both analog and digital components.

Generally, the RF/MSD subsystem 130 includes a receiver 200, a synthesizer 300 and a transmitter 400. In this example, the RF/MSD subsystem 130 includes an analog-to-digital converter 134, and the transmitter 400 includes one or more digital-to-analog converters (DACS) 142 and 144.

In an embodiment, the baseband subsystem 110 provides an automatic power control signal (supplied as an analog voltage signal and referred to as $V_{APC}$) to the RF/MSD subsystem 130. Although shown as a single connection 132, the control signals may originate from the DSP 126 from the microprocessor 120, or from another element, and are supplied to a variety of points within the RF/MSD subsystem 130 by the DAC 142. It should be noted that, for simplicity, only the basic components of portable transceiver 100 are illustrated.

The ADC 134, the DAC 142 and the DAC 144 also communicate with microprocessor 120, memory 122, analog circuitry 124 and DSP 126 via bus 128. The DAC 144 converts the digital communication information within baseband subsystem 110 into an analog signal for transmission by the transmitter 400 via connection 140.

Connection 140, while shown as two directed arrows, includes the information that is to be transmitted by RF/MSD subsystem 130 after conversion from the digital domain to the analog domain.

The DAC 144 may operate on either baseband in-phase (I) and quadrature-phase (Q) components or phase and amplitude components of the information signal. In the case of I and Q signals, the modulator 146 is an I/Q modulator as known in the art while in the case of phase and amplitude components, the modulator 146 operates as a phase modulator utilizing only the phase component and passes the amplitude component, unchanged, to the power control element 145. The DAC 142 supplies various other control signals to various components within the RF/MSD subsystem 130 via connection 132.

The modulator 146 modulates either the I and Q information signals or the phase information signal received from the DAC 144 onto a frequency reference signal referred to as a "local oscillator" or "LO" signal provided by the synthesizer 300 via connection 156. In this example, the modulator 146 is part of the upconverter 154, but need not be. The frequency plans employed by the single chip GSM/EDGE transceiver, to be described below, allow the use of a harmonic rejection type I/Q modulator with minimal post-modulation filtering.

The modulator 146 also supplies an intermediate frequency (IF) signal containing only the desired amplitude modulated (AM) signal component on connection 138 for input to the power control element 145 via connection 138.

The AM signal supplied by the modulator via connection 138 is first supplied to a reference variable gain element associated with the RF subsystem 130. The AM signal supplied by the modulator 146 is an intermediate frequency (IF) AM signal with a constant (average) power level that is supplied as a reference signal to the reference variable gain element to be described below. The operation of the power control element 145, which forms a closed power control loop, will be described below with reference to FIG. 4.

The synthesizer 300, which will be described below, determines the appropriate frequency to which the upconverter 154 will translate the modulated signal. In this embodiment, the synthesizer uses a single voltage controlled oscillator (VCO), operating at a center frequency of approximately 2.5 to 3.0 gigahertz (GHz) in this example, and only frequency dividers to provide the desired LO signals to the transmitter 400 and to the receiver 200.

The upconverter 154 supplies a phase modulated signal at the appropriate transmit frequency via connection 158 to the power amplifier 160. The power amplifier 160 amplifies the phase modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132.

In one embodiment, a portion of the amplified transmit signal power on connection 162 can be supplied via connection 170 to power control element 145. In this embodiment, the power control element 145 forms a continuous closed power control feedback loop and supplies an information signal on connection 172 instructing the power amplifier 160 as to the power to which the signal on connection 158 should be amplified. The power control element 145 also receives an LO signal from the synthesizer 300 via connection 198. A synthesizer 300 having a single VCO supplies all of the required LO signals to the receiver 200 and the transmitter 400.

A signal received by antenna 164 may, at the appropriate time determined by baseband subsystem 110, be directed via switch 166 to a receive filter 168. The receive filter 168 filters the received signal and supplies the filtered signal on connection 174 to a low noise amplifier (LNA) 176. Although a single LNA 176 is shown in FIG. 1, it is understood that a plurality of LNAs are typically used, depending on the frequency or frequencies on which the portable transceiver 100 operates. The receive filter 168 may be a bandpass filter that passes all channels of the particular cellular system where the portable transceiver 100 is operating. As an example, for a 900 MHz GSM system, receive filter 168 would pass all frequencies from 925.1 MHz to 959.9 MHz, covering all 175 contiguous channels of 200 kHz each. The purpose of the receive filter 168 is to reject all frequencies outside the desired region. The LNA 176 amplifies the very weak signal on connection 174 to a level at which down converter 178 can translate the signal from the transmitted frequency back to a baseband frequency. Alternatively, the functionality of the LNA 176 and the down converter 178 can be accomplished using other elements, such as, for example but not limited to, a low noise block downconverter (LNB). In this example, the receiver 200 operates as a direct conversion receiver (DCR) in which the received RF signal is downconverted directly to a baseband signal. In one embodiment, the LNA 176 is fully differential and operates using no voltage gain such that large electric fields are eliminated at the input to the LNA 176.

The downconverter 178 receives one or more LO signals from synthesizer 300 via connection 180. In this embodiment, the LO signals are shifted in phase by approximately 45 degrees to provide frequency translation of the in-phase and the quadrature-phase received signals without the use of polyphase filters or large inductances in the receive signal path. The synthesizer 300 determines the frequency to which to downconvert the signal received from the LNA 176 via connection 182. In the case of a DCR, the received signal is converted directly to baseband (DC), or near-baseband. The downconverter 178 sends the downconverted signal via connection 184 to a channel filter 186, also called the "IF filter." The channel filter 186 selects the one desired channel and rejects all others. Using the GSM system as an example, only one of the 175 contiguous channels is actually to be received. After all channels are passed by the receive filter 168 and downconverted in frequency by the downconverter 178, only the one desired channel will appear precisely at the center frequency of channel filter 186. The synthesizer 300, by controlling the local oscillator frequency supplied on connection 180 to downconverter 178, determines the selected channel. The demodulator 194 recovers the transmitted analog information and supplies a signal representing this information via connection 196 to the ADC 134. The ADC 134 converts these analog signals to a digital signal at baseband frequency and transfers it via bus 128 to DSP 126 for further processing.

Figure 2:
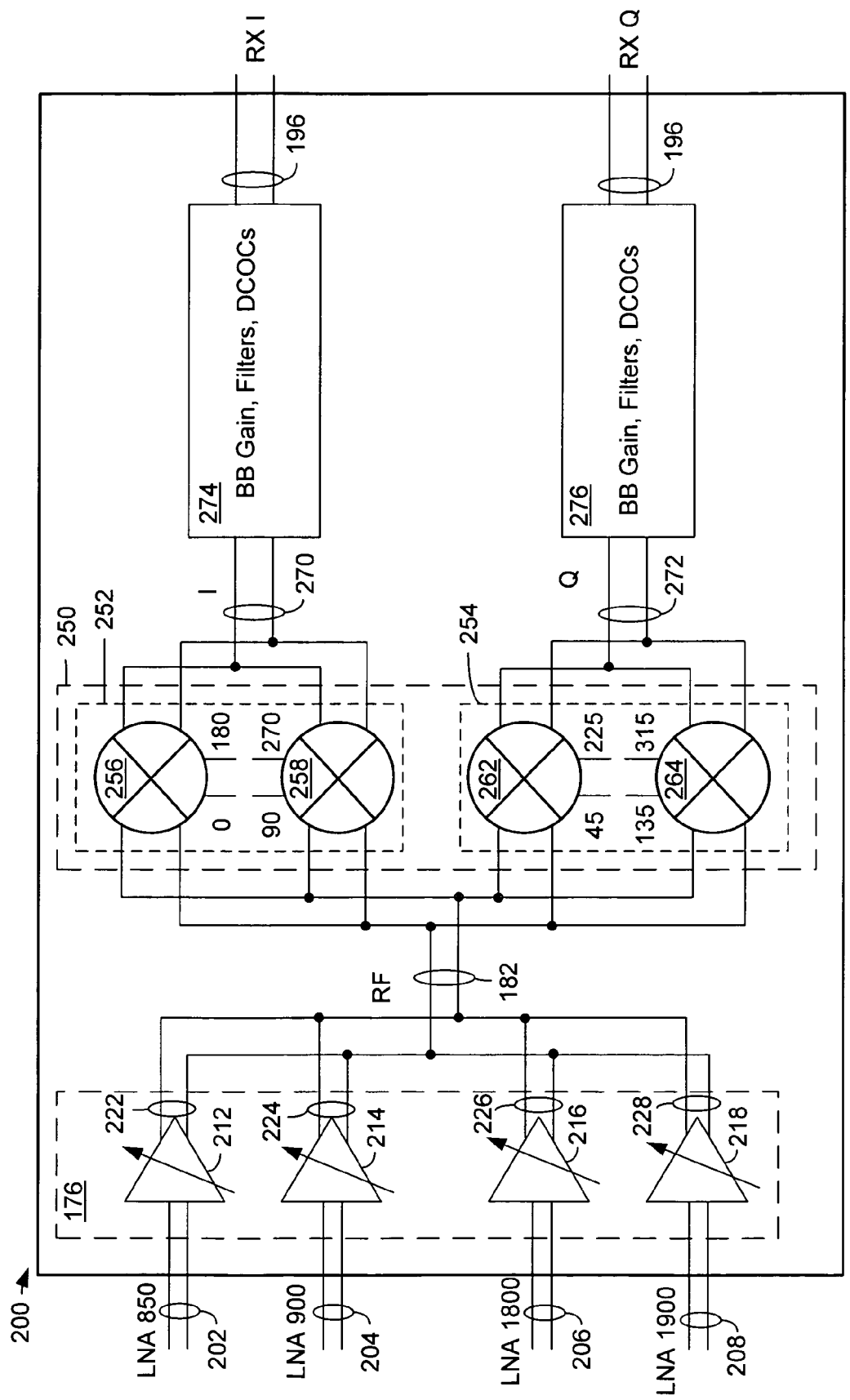
FIG. 2 is a schematic diagram illustrating the receiver of FIG. 1.

FIG. 2 is a schematic diagram illustrating the receiver 200 of FIG. 1. The depiction of the receiver 200 is simplified to illustrate primarily the concepts of the GSM/EDGE transceiver architecture that pertain to the receiver 200. The receiver 200 includes an LNA section 176, a downconverter section illustrated using mixer 250 and both in-phase and quadrature-phase gain and filter elements 274 and 276. In this embodiment, the LNA section 176 comprises LNAs 212, 214, 216 and 218, each designed to receive a signal in a particular transmission frequency band. The LNAs 212, 214, 216 and 218, and all the elements in the receiver to be described below, provide no voltage gain and are fully differential, thereby eliminating the need for single ended to differential conversion circuitry, and eliminating the need for additional amplification of the received signal. In this example, the LNAs 212 and 214 operate in the GSM communication band and the LNAs 216 and 218 operate in the PCS communication band. The LNA 212 is designed to receive a differential 850 MHz receive signal via connection 202 and the LNA 214 is designed to receive a differential 900 MHz receive signal via connection 204. The LNA 216 is designed to receive a differential 1800 MHz receive signal via connection 206 and the LNA 218 is designed to receive a differential 1900 MHz receive signal via connection 208. The outputs of the LNAs 212, 214, 216, and 218 are supplied via connection 182 directly to the mixer 250. In this embodiment, the fully differential LNAs 212, 214, 216 and 218 are designed to eliminate the characteristic large input impedance that is common in receivers that require an RF phase shifting network. In this manner, a receive signal at the input of the LNAs 212, 214, 216 and 218 experiences minimal loss, and requires little or no additional amplification through the receiver 200.

To provide the in-phase and quadrature-phase downconversion, the mixer 250 is a sub-harmonic mixer designed to operate using sub-harmonic frequency, phase shifted LO signals instead of a phase shifted RF signal. Using phase shifted LO signals, the generation of which will be described below, allows the receiver 200 to be free of costly and power consuming so called "poly-phase" filter networks. In the past, the phase of the received RF signal was shifted by one or more poly-phase filter networks to achieve the in-phase and quadrature-phase downconversion. In the GSM/EDGE transceiver architecture described herein, the mixer 250 employs phase-shifted LO signals to perform the downconversion, thereby eliminating the need for the poly-phase filters. The use of the phase-shifted LO signals allows the output of the LNAs 212, 214, 216 and 216 to be combined and supplied to a single mixer 250. This leads to a reduction in die size and a simplified receiver design. In this embodiment, the signal path from the input of the LNA section 176 to the output of the mixer 250 is fully differential, thus reducing DC offset, receiver self-mixing, frequency variations between the in-phase and quadrature-phase channels, and minimizing degradation of the signal-to-noise ratio (s/n) and leakage of the transmit signal through the receive path. Further, because there is no additional amplification used in the receiver 200, the power consumption of the receiver 200 is minimized.

The mixer 250 comprises in-phase mixer element 252 and quadrature-phase mixer element 254. The in-phase mixer element 252 includes mixer cores 256 and 258. The quadrature-phase mixer element 254 comprises mixer cores 262 and 264. The received RF signal is coupled via connection 182 to the mixer cores 256, 258, 262 and 264. The mixer cores 256, 258, 262 and 264 receive phase-shifted LO signals from the synthesizer 300, which will be described in detail below. By employing phase-shifted LO signals, the RF input signal supplied to the mixer stays intact, thus eliminating the need for a phase shifting network (such as one or more poly-phase filters) in the RF path. Further, the use of fully differential LNA section 176 and the single mixer 250 substantially improve the second intercept point (IP2) performance of the receiver 200 to the point where IP2 calibration is not necessary.

The ability to use a single mixer 250 allows the die area consumed by the receiver 200 to be minimized and simplifies the layout of the integrated circuit on which the receiver 200 is formed. Further, simplifying the layout of the integrated circuit minimizes parasitic capacitances, makes the receiver design more symmetrical than if two or more mixers were used, and simplifies and minimizes receive gain calibration for different receive bands. Further, minimizing the voltage of the RF signal prior to the mixer 250 helps minimize RF self-mixing, which can occur if large RF voltage couples or radiates onto the LO ports of the mixer 250. Further, a fully differential path from the input of the down-converter to its output (i.e., from the input to the LNA section 176 to the output of the in-phase and quadrature-phase gain and filter elements 274 and 276) allows the minimization of another IP2 mechanism, which is related to asymmetric analog processing of the positive and negative half-waveform of the input signal.

In an embodiment, 0 degree and 180 degree LO signals are supplied to the mixer core 256, 90 degree and 270 degree LO signals are supplied to the mixer core 258, 45 degree and 225 degree LO signals are supplied to the mixer core 262, and 135 degree and 315 degree LO signals are supplied to the mixer core 264. The differential output of the in-phase mixer element 252 is supplied via connection 270 to the in-phase gain and filter element 274, and the differential output of the quadrature-phase mixer element 254 is supplied via connection 272 to the quadrature-phase gain and filter element 276. The baseband section of the receiver 200, illustrated as the baseband gain and filtering elements 274 and 276 provide gain, channel select filtering that enables the receiver 200 to meet the GSM standard, and DC offset compensation (DCOC). Various stages of filtering, followed by gain are employed, as known in the art.

The differential output of the in-phase gain and filter element 274 and the differential output of the quadrature-phase gain and filter element 276 is supplied via connection 196 to the ADC 134 (FIG. 1) for conversion to the digital domain and further processing the baseband subsystem 110.

Figure 3:
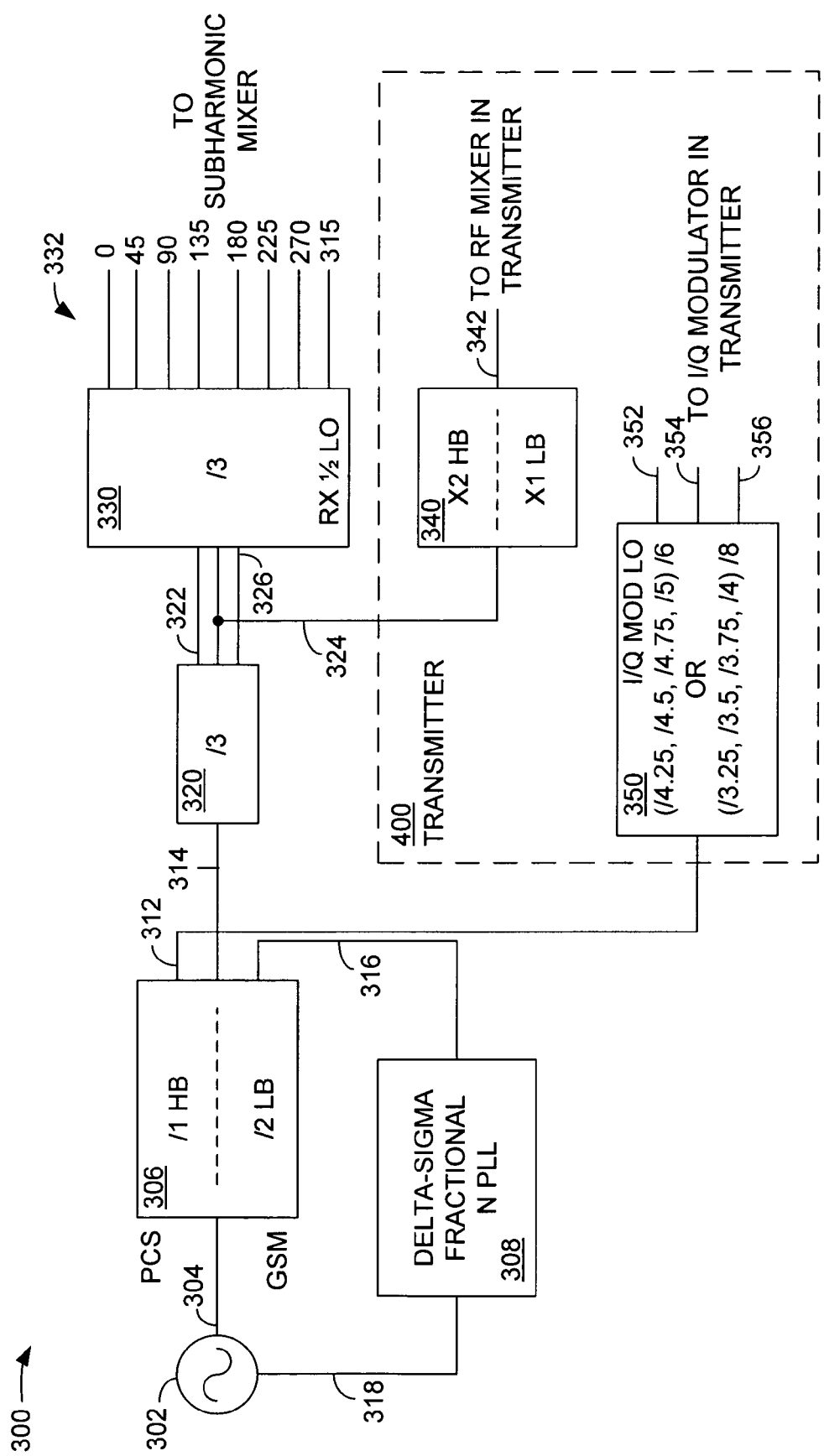
FIG. 3 is a schematic diagram of the synthesizer of FIG. 1.

FIG. 3 is a schematic diagram of the synthesizer 300 of FIG. 1. The synthesizer 300 includes a voltage controlled oscillator (VCO) 302 designed to operate approximately in the 2.5-3.0 gigahertz (GHz) frequency range, and in one embodiment, has a center frequency of approximately 2.8 GHz and a tuning range of approximately +/−250 megahertz (MHz). The output of the VCO 302 is supplied via connection 304 to a frequency divider 306. In this embodiment, when used for high band operation in the PCS 1800/1900 frequency band, the frequency divider 306 divides the input frequency on connection 304 by one (1). When used for low band operation in the GSM 850/900 frequency band, the frequency divider 306 divides the input frequency on connection 304 by two (2).

When used to supply signals to the receiver 200, the output of the frequency divider 306 is sent via connection 314 to another frequency divider 320. The frequency divider 320 divides the frequency of the signal on connection 314 by three (3) and supplies outputs on connections 322, 324 and 326 to a phase combiner 330.

The use of a VCO 302 operating at approximately 2.8 GHz, and the frequency dividers 306 and 320 eliminate the need for frequency multipliers in the synthesizer 300.

Compared with frequency multipliers, frequency dividers consume less die area on the integrated circuit chip, generate less noise and consume less power. The dividers 306 and 320 generally provide a wide range of operation while maintaining the phase accuracy of the input signals and provide a consistent harmonic content.

The /2 low band output of the frequency divider 306 is supplied via connection 316 to the phase locked loop (PLL) 308. In this embodiment, the phase locked loop 308 is a delta-sigma fractional N phase locked loop. The output of the phase locked loop 308 is supplied via connection 318 as feedback to the VCO 302.

In the receive mode, the phase combiner 330 generates the ½ LO phase-shifted LO signals that are supplied to the sub-harmonic mixer 250 (FIG. 2). The phase combiner 330 occupies significantly less area on the die and consumes less power when compared to a poly-phase filter network, and supplies accurate nominal 45 degree phase-shifted signals on connections 332. In this embodiment, the phase combiner supplies 0, 45, 90, 135, 180, 225, 270 and 315 degree LO signals for downconverting the RF signal in the sub-harmonic mixer 250 (FIG. 2). The phase combiner 330 receives an IF signal on connections 322, 324 and 326. The phase of the signal on connection 322 is 0 degrees, the phase of the signal on connection 324 is 60 degrees and the phase of the signal on connection 326 is 120 degrees. The phase combiner 330 receives 3 phases, 0, 60 and 120 degrees, of the divide by three output of the divider 320. From these 0, 60 and 120 degree phases, 0 and 90 degree (relative to each other) signals are generated. From the 0 and 90 degree signals, the 0, 45, 90, 135, 180, 225, 270 and 315 degree signals are generated. This signal generation occurs in the phase combiner 330.

The output of the divider 320 on connection 324 is also supplied to components in the transmitter 400, but which are illustrated in FIG. 3 for ease of description of the synthesizer 300. Portions of the transmitter 400 are shown in FIG. 3 for reference. As it pertains to the synthesizer 300, the transmitter 400 comprises an I/Q modulator divider 350 and an LO multiplier element 340. The LO multiplier element 340 provides the frequency reference LO signal to a mixer located in the transmitter 400, and which will be described below. In high band operation, the LO multiplier element 340 multiplies the signal on connection 324 by a factor of two (2) and supplies the multiplied signal via connection 342 (connection 198 in FIG. 1) to the transmitter 400. In low band operation, the LO multiplier element 340 multiplies the signal on connection 324 by a factor of one (1) and supplies the signal via connection 342 (connection 198 in FIG. 1) to the transmitter 400.

The I/Q modulator divider 350 receives the output of the frequency divider 306 on connection 312 and operates on it to provide the proper LO signal to the modulator 146 (FIG. 1) via connections 352, 354 and 356. The I/Q modulator divider 350 can be implemented using a number of different divide factors, depending on the implementation of the modulator. In one embodiment, the I/Q modulator divider 350 is implemented to have a first stage programmable to divide by 4.25, 4.5, 4.75, or 5, and a second stage to divide by 6. In another embodiment, the I/Q modulator divider 350 is implemented to have a first stage programmable to divide by 3.25, 3.5, 3.75, or 4, and a second stage to divide by 8. Having at least two divide options maximizes flexibility in the transmit frequency plan. In this manner, the same RF transmit frequency can be generated from the different combination of the UHF LO frequency and interim intermediate frequency. Such flexibility is desirable because in many cases some M×N products of different frequencies coexist in the chip and would generate unwanted spurious tone or tones. The unwanted spurious tones could cause the transceiver to fail either far-off or close-in spectrum/spurious emission requirements. In this embodiment, the last frequency divider for IF generation for the I/Q modulator is a multiple of either 3 or 4 due to the particular architectures of the harmonic reject I/Q modulators that will likely be implemented as the modulator 146 (FIG. 1). In one embodiment, the modulator 146 can be implemented with an additional ±30 degree phase shifted LO in addition to the normal 90 degrees. In another embodiment the I/Q modulator 146 can be implemented with three (3) differential 45 degree phase-shifted LO signals.

Figure 4:
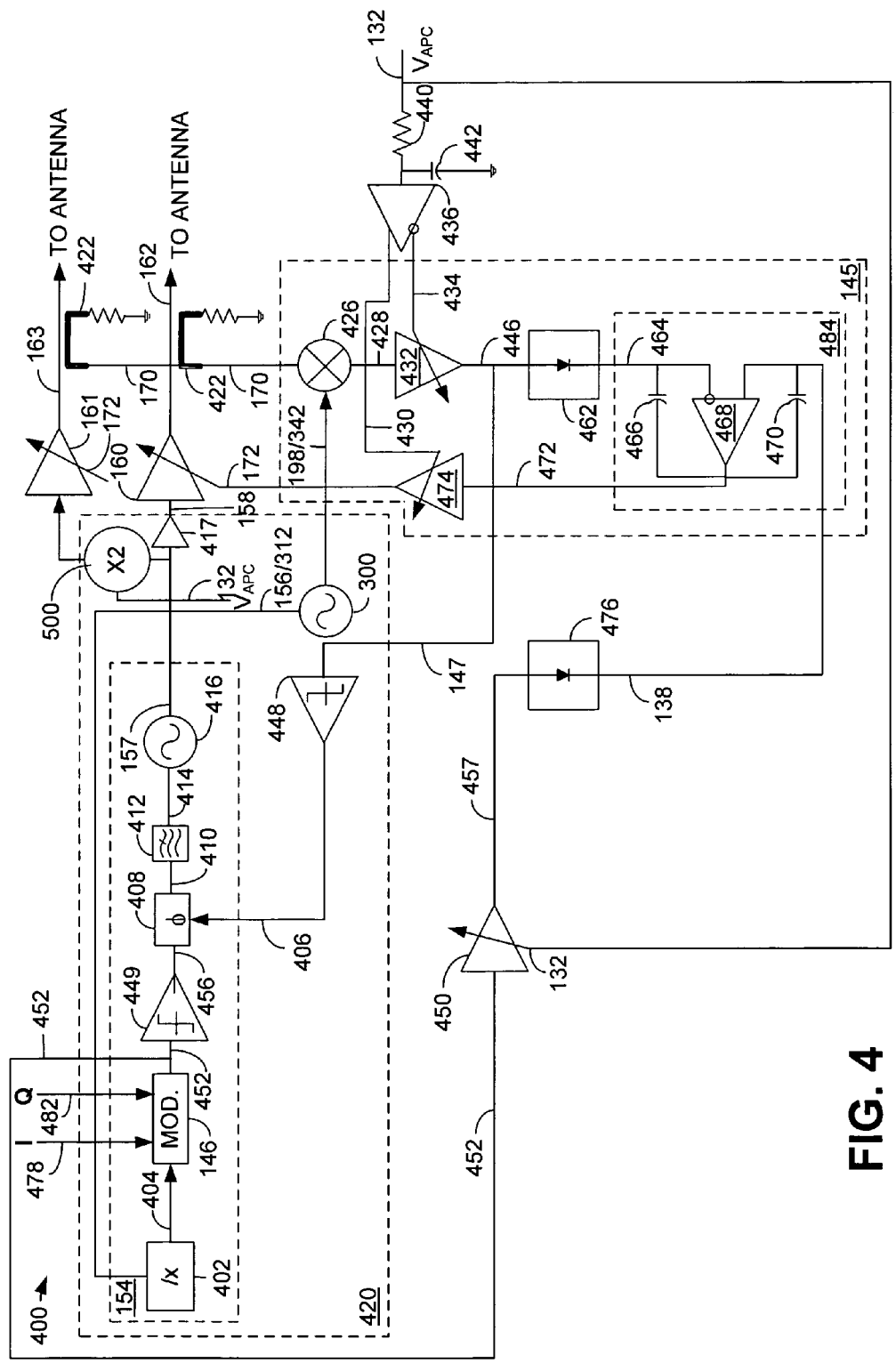
FIG. 4 is a block diagram illustrating the transmitter of FIG. 1.

FIG. 4 is a block diagram illustrating the transmitter 400 of FIG. 1. Beginning with a description of the power control loop 145, a portion of the output power present at the output of power amplifier 160 on connection 162 is diverted by a coupler 422 via connection 170 and input to a mixer 426 in the feedback path. When implementing the transmitter using a single chip architecture in which the transmitter and the power control loop 145 are implemented on the same chip, is desirable to maximize the isolation between the input of the power amplifier 160 (or 161) and the input to the power control loop 145 on connection 170, particularly at low output power levels.

The mixer 426 is also referred to as an "RF" mixer. The mixer 426 receives a local oscillator (LO) signal from the LO multiplier element 340 in the synthesizer 300 via connection 342 (198 in FIG. 1). In an embodiment, the desired LO signal on connection 342 is generated using only one frequency multiplication (performed by the LO multiplier element 340 for high band operation) and no frequency multiplication for low band operation.

The mixer 426 downconverts the "RF" signal on connection 170 to an intermediate frequency (IF) signal on connection 428. For example, the mixer 426 translates a signal having a frequency of approximately 2 gigahertz (GHz) on connection 170 to a frequency of approximately 100 megahertz (MHz) on connection 428 for input to the variable gain element 432. The variable gain element 432 can be, for example but not limited to, a variable gain amplifier or an attenuator. In such an arrangement, the variable gain element 432 might have a total variable gain range of approximately 70 decibels (dB). The variable gain element 432 receives a control signal input from the inverting output of amplifier 436 via connection 434. The input to amplifier 436 is supplied via connection 132 from the DAC 142 of FIG. 1. The signal on connection 132 is the reference voltage automatic power control signal, $V_{APC}$, that determines the transmit power level and provides the power profile. The $V_{APC}$ signal on connection 132 is supplied to a reconstruction filter, which includes resistor 440 and capacitor 442. In this manner, a reference voltage for the transmit power level and power profile is supplied via connection 434 to the control input of the variable gain element 432. As will be described below, the $V_{APC}$ signal on connection 132 is also supplied to a variable gain frequency multiplier 500.

The output of variable gain element 432 on connection 446 is at an intermediate frequency having both an AM component and a PM component and is called the "power measurement signal." This power measurement signal is related to the absolute output power of power amplifier 160, and includes a very small error related to the AM and PM components present in the signal. The output of variable gain element 432 on connection 446 is supplied to the input of a power detector 462 and is also supplied to a limiter 448 in the phase locked loop 420, although the limiter 448 may reside outside of the phase locked loop 420.

The IF signal on connection 446 includes both an AM component and a PM component. The IF signal on connection 446 is supplied to the power detector 462, which provides, on connection 464, a baseband signal representing the instantaneous level of IF power present on connection 446. The output of power detector 462 on connection 464 is supplied to the inverting input of amplifier 468.

The amplifier 468, capacitor 466 and capacitor 470 form a comparator 484, which provides the error signal used to control the power amplifier 160 via connection 472. The non-inverting input to the amplifier 468 is supplied via connection 138 from a power detector 476. The output of the modulator 146 on connection 452 is supplied to a reference variable gain element 450. In this embodiment, the reference variable gain element 450 can be implemented as a variable gain amplifier (VGA), which is similar to the variable gain elements 432 and 474, but which has a different gain characteristic.

The signal supplied to the reference VGA on connection 452 comprises an IF signal containing the amplitude modulation (AM) portion of the modulated signal. The reference VGA 450 receives the $V_{APC}$ signal via connection 132 to its control input. The reference VGA 450 extends the dynamic range of the AM control signal that is supplied through the power detector 476 to the non-inverting input of the amplifier 468 in the comparator 484. The signal on connection 138 supplied to the non-inverting input of amplifier 468 contains the demodulated amplitude information of the AM signal developed by the modulator 146.

The gain of the power control loop 145 amplifies the signal on connection 472 such that the difference between the signals on connections 464 and 138 input to amplifier 468 provide an error signal on connection 472. The error signal on connection 472 is used to control the output of the power amplifier 160. The error signal on connection 472 is supplied to the variable gain element 474, which can be similar in structure to the variable gain element 432. However, the variable gain element 474 has a gain function that is the inverse of the gain function of the variable gain element 432, since the control input to the variable gain element 432 is supplied from the inverting output of amplifier 436. In this manner, the power amplifier control signal on connection 172 supplied to the control port of power amplifier 160 drives the power amplifier 160 to provide the proper output on connection 162. For high band operation, the power amplifier control signal on connection 172 supplied to the control port of power amplifier 161 and drives the power amplifier 161 to provide the proper output on connection 163.

The level of the signal on connection 464 and the level of the signal on connection 138 will be nearly equal, by the function of the negative feedback in the power control loop 145. For example, if the output level of the variable gain element 432 is increased by a factor of 10, then the level of the output of power amplifier 160 will decrease accordingly to maintain equilibrium at the input of the amplifier 468. The output of the power amplifier 160 changes to cancel the gain change of variable gain element 432. In this manner, the feedback amplitude signal on connection 464 remains nearly equal to the reference amplitude signal on connection 138. In this manner, a feedback signal containing an AM and a PM portion is present on connection 446. The signal on connection 446 is converted by power detector 462 from an IF signal to a baseband signal on connection 464. The difference between the signal on connection 464 and the signal on connection 138 is amplified by amplifier 468 and amplifier 474 to drive the power amplifier control port on connection 172 so that the desired signal is achieved at the output of the power amplifier 160 on connection 162. The power control loop 145 has sufficient gain so that the error signal on connection 472 can be kept small. In such a case, the gain changes of the variable gain element 432 and the power amplifier 160 will substantially be the inverse of each other.

The amplifier 468 compares the power measurement signal on connection 464 with a reference voltage signal from the reference detector 476 on connection 138, representing the AM portion of the signal supplied by the modulator 146. The output of amplifier 468 on connection 472 is the amplitude error signal. The DC voltage level on connection 138 affects the desired static output power for the amplifier 468, irrespective of AM modulation. The amplifier 468 compares the signal level on connection 464 with the signal level on connection 138 and then amplifies the difference, thus providing an error signal on connection 472. The comparator 484 functions as an integrator, which is also a low pass filter.

The reference VGA 450 extends the amplitude control range. The reference VGA 450, which is located outside of the power control loop, controls the level of the reference signal supplied to the power control loop 145. The gain characteristic of the reference VGA 450 differs from the gain characteristic of the variable gain elements 432 and 474. The reference VGA 450 maintains a constant gain over the majority of the amplitude range of the power control loop 145, including the highest output amplitude levels. However, when the output amplitude is at the low end of the range (the range of the analog power control signal $V_{APC}$), i.e., when the value of $V_{APC}$ is low, the gain of the reference VGA 450 is reduced. In this manner, the reference VGA 450 maintains closed loop amplitude control down to the lowest output power levels, and particularly, during transmit power ramp-up and transmit power ramp-down, when $V_{APC}$ is at a predetermined minimum value. The gain range of the reference VGA 450 is realized as what is referred to as a "soft step" function, and is not linear. The gain of the reference VGA 450 is shifted down by an appropriate amount (for example 15 or 18 dB) when the power control voltage $V_{APC}$ is at a level sufficiently low to indicate that the transmitter (e.g., the upconverter 154 and the power amplifier 160) is in either ramp-up or ramp-down and not at a constant output power level. The dynamic range of the power detectors 462 and 476 limits the amplitude control provided by the variable gain element 432 and the variable gain element 474. The reference VGA 450 provides amplitude control at power output levels lower than the minimum power output associated with a minimum $V_{APC}$ signal level. For example, this "soft step" function can be implemented for a $V_{APC}$ signal level of approximately 0.6V when it is known that the power control characteristic of the power amplifier 160 will always generate output power levels below 0 dBm for this value of $V_{APC}$ voltage.

The power amplifier control signal on connection 172 is driven by the variable gain element 474, which corrects for the effect that variable gain element 432 has on the transfer function of the power control loop 145. The variable gains of variable gain element 432 and variable gain element 474 are complimentary. Because the feedback power measurement signal is present on connection 464 and the amplitude reference signal is present on connection 138, the amplifier 468 provides a dual function; (1) it amplifies the AM error signal (the difference between the signal on connection 138 and the signal on connection 464) so as to modulate the power output of power amplifier 160 via connection 172 to have the correct amount of AM; and (2) it performs the average power comparison and amplifies the result, thus providing a control signal also via connection 172 that drives the power amplifier 160 to the correct average power output. Therefore, at connection 172 both the AM error signal and the power control error signal are amplified to a level sufficient to drive the power amplifier 160 to the desired average power with the desired AM signal. In this manner, the desired AM portion of the signal is supplied to the control input 172 of power amplifier 160 and made present on the power amplifier output on connection 162. The mixer 426, variable gain element 432, power detector 462, amplifier 468 and variable gain element 474 provide a continuous closed-loop power control feedback system to control the power output of power amplifier 160, while allowing for the introduction of the AM portion of the transmit signal via connection 138.

At all times, the continuous power-control feedback loop allows the correction of any phase shift caused by power amplifier 160. In this manner, the PLL 420 includes a feedback loop for looping back the output of power amplifier 160 to the input of phase/frequency detector 408. Any unwanted phase shift generated by the power amplifier 160 will be corrected by the PLL 420. The output of variable gain element 432 passes any phase distortion present via connection 446 to limiter 448 for correction by the PLL 420. As such, the phase of the output of power amplifier 160 is forced to follow the phase of the LO signal on connection 156 (FIG. 1) and referred to as connection 312 in FIG. 4.

In order to remove the AM from the output of variable gain element 432, the variable gain element 432 is connected via connection 446 and connection 147 to the input of limiter 448. The limiter 448 develops a feedback signal containing only a PM component on connection 406. The baseband I and Q information signals are supplied via connections 478 and 482, respectively, to the modulator 146. The I and Q baseband information signal interface is understood by those having ordinary skill in the art. As a result of the operation of the modulator 146, the output on connection 452 is an intermediate frequency signal including an AM component providing an AM reference signal and a PM component providing a PM reference signal. The output of modulator 146 is supplied via connection 452 to the reference VGA 450. The output of the reference VGA 450 is supplied to the power detector 476 to ensure that the power detector 476 receives a signal having constant average power, thus reducing the dynamic range requirement of the power detector 476 to only what is needed to cover the modulation range, which is typically less than 20 dB. The output of the power detector 476 is a voltage signal representing the amplitude of the desired transmit signal. In this manner, the signal provided on connection 138 is a reference signal that allows amplitude control of the power control loop 145 at power output levels over the full output power range, thus expanding the closed loop control range of the power control loop 145 to over 65 dB.

The modulator 146 also provides the PM component of the signal on connection 452. This PM signal is then supplied to limiter 449, which outputs a signal on connection 456 containing the phase reference component. The components within the phase locked loop 420 provide gain for the comparison of the PM on connection 456 and the phase feedback signal on connection 406, thus providing a phase error output of the phase detector 408 on connection 410. In this manner, a feedback signal taken from the output of variable gain element 432 on connection 446 is supplied as continuous feedback to the phase locked loop 420.

The error signal output of modulator 146 on connection 452 containing the phase error, will get smaller and smaller as the gain of the phase locked loop 420 increases. However, there will always be some error signal present, thus enabling the phase locked loop 420 to achieve phase lock. It should be noted that even when the power amplifier 160 is not operating, there will always be some small leakage through the power amplifier 160 onto connection 162. This small leakage is sufficient to provide a feedback signal through the variable gain element 432 and into the phase locked loop 420 such that the phase locked loop 420 can be locked using just the leakage output of power amplifier 160. In this manner, a single feedback loop can be used to continuously control the output power of power amplifier 160 from the time that the amplifier is off through the time when the amplifier 160 is providing full output power.

The modulator 146 receives an LO input signal from synthesizer 300 via connection 312 (156 in FIG. 1). The LO signal is frequency divided by a number "x" in order to provide a signal having an appropriate frequency on connection 404. The number "x" is chosen so as to minimize the design complexity of the synthesizer 300 and can be, for example, but not limited to, chosen to convert the output of the synthesizer 300 to a frequency of about 100 MHz.

The output of phase/frequency detector 408 on connection 410 is a digital signal having a value of either a 0 or a 1 with a very small transition time between the two output states. This signal on connection 410 is supplied to low-pass filter 412, which integrates the signal on connection 410 and places a DC signal on connection 414 that controls the frequency of the transmit voltage control oscillator (TX VCO) 416. In low band operation, the output of TX VCO 416 is supplied via connection 157 to a low band output buffer 417. In low band operation, the output of the low band output buffer 417 is directed to the power amplifier 160 via connection 158. In high band operation, the output of the TX VCO 416 is directed to a variable gain frequency multiplier 500. The variable gain frequency multiplier 500 multiplies the frequency of the output of the TX VCO 416 with an adjustable gain that is controlled by the $V_{APC}$ signal on connection 132. The variable gain frequency multiplier 500, which will be described in detail below, eliminates the need to have a separate high band TX VCO and allows the use of a single TX VCO 416. The variable gain frequency multiplier 500 also acts as an output buffer in the high band. The output of the variable gain frequency multiplier 500 is supplied to amplifier 161, which supplies an output over connection 163.

The synthesizer 300, limiter 448, modulator 146, limiter 449, divider 402, phase/frequency detector 408, low-pass filter 412 and TX VCO 416 form a phase locked loop (PLL) 420, which is used to determine the transmit frequency on connection 158. When the PLL 420 is settled, or "locked," then the two signals entering the phase/frequency detector 408 on connections 456 and 406 have precisely the same phase and frequency, and the output of the phase/frequency detector 408 on connection 410 goes to zero. The output of the integrating low-pass filter 412 on connection 414 stabilizes, resulting in a fixed frequency out of TX VCO 416. For example, the synthesizer 300 and the mixer 426 ensure that the frequency of the signal output from the TX VCO 416 on connection 158 tracks the sum of the frequencies of the local oscillator signal supplied by synthesizer 300 and the IF frequency on connection 406.

When the phase locked loop 420 is locked, the phase of the signal on connection 456 and the phase of the signal on connection 406 will be equal. The gain in the phase locked loop 420 has to be sufficiently high to amplify the error signal on connection 406 to a level at which the phase/frequency detector 408 can make a comparison. By using the modulator 146 to impose the I and Q information signals on the signal on connection 404, and because the phase locked loop 420 will keep the phase of the TX VCO 416 locked, the phase of the signal output from the TX VCO 416 on connection 158 will follow that of the phase imposed by the modulator 146. In this manner, the PM error signal present on connection 410 is minimized by the very high sensitivity, of the order of many MHz per volt, of the TX VCO 416.

Because the power control loop 145 is a closed loop for AM signals at connection 138, it is possible to use a non-linear, and therefore highly efficient, power amplifier 160. Furthermore, the undesirable and detrimental AM-to-PM conversion, which occurs due to the amplitude dependence of an amplifier's phase shift, is rectified by the power amplifier 160 being included within the phase locked loop 420. By separating the AM and the PM modulation and by providing closed loop control for both the AM and PM modulation, a non-linear, and therefore highly efficient power amplifier can be used.

In some applications it is desirable to allow the power amplifier 160 to output a signal containing both an AM component and a PM component, while maintaining the power amplifier 160 as a non-linear (and therefore highly efficient) power amplifier. In such a case, the output of modulator 146 will include both an AM and a PM component, with limiter 449 used to cancel the AM component present on connection 452, thereby preventing any AM-to-PM conversion in the phase/frequency detector 408.

Figure 5:
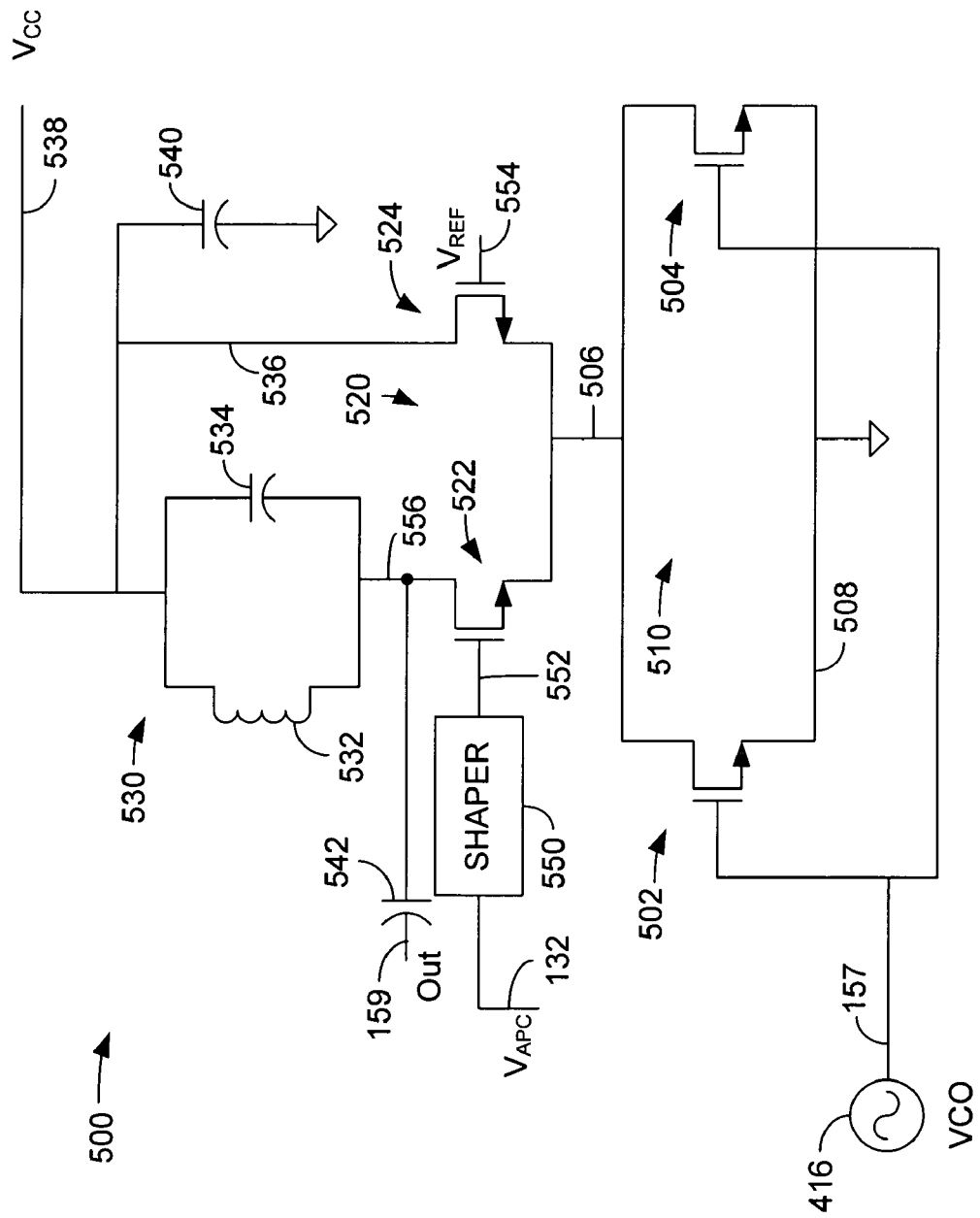
FIG. 5 is a schematic diagram illustrating an embodiment of the variable gain frequency multiplier of FIG. 4.

FIG. 5 is a schematic diagram illustrating an embodiment of the variable gain frequency multiplier of FIG. 4. The variable gain frequency multiplier 500 comprises a multiplier circuit 510, a control circuit 520 and a tuned output circuit, also referred to as a "tank" circuit 530. The multiplier circuit 510 comprises, in this example, a pair of transistors 502 and 504. In this example, the transistors 502 and 504 are field effect transistors, but other transistor designs are possible. The TX VCO 416 supplies, in this example, an approximate 1 gigahertz (GHz) alternating voltage signal via connection 157 to the gate terminals of the transistors 502 and 504. In this manner, the transistors 502 and 504 rectify and multiply the input signal from the TX VCO 416 to provide a nominal 2 GHz signal on connection 506.

The 2 GHz signal on connection 506 is supplied to the control circuit 520. The control circuit 520 comprises a pair of transistors 522 and 524. The transistors 522 and 524 are similar to the transistors 502 and 504 discussed previously. The $V_{APC}$ signal on connection 132 is supplied to a shaping circuit 550. The output of the shaping circuit is supplied via connection 552 to the gate terminal of the transistor 522. The shaping circuit 550 receives as input a signal that is generated based on the ratio of the output power of the power amplifier 160 with respect to the control signal $V_{APC}$, which will be described below in FIG. 7.

The drain terminal of the transistor 522 is coupled to the tuned output circuit 530 and to the output terminal 159 via a capacitor 542. The tuned output circuit 530 shown here is one of many possible configurations of a tuned circuit. Other known configurations can also be used. The drain terminal of the transistor 524 is coupled directly to system voltage $V_{CC}$ via connection 538. The tuned output circuit 530 comprises an inductor 532 and a capacitor 534, and is also coupled to system voltage $V_{CC}$ via connection 538. However, radio frequency radiation from the tuned output circuit 530 is likely to leak into the input 170 of the power control element 145 (FIG. 4). Therefore, in accordance with an embodiment of the invention, at low power levels, when leakage from the tuned output circuit 530 is likely to cause significant disturbance to the power control element 145, the signal current at connection 506, which is the output of the multiplier 510 in FIG. 5, bypasses the tuned output circuit 530 and is connected to the voltage supply 538 through transistor 554. At low power levels (corresponding to a low Vapc value on connection 132), the output voltage swing at node 556 will be reduced. Therefore, the unwanted RF coupling to the mixer 426 (FIG. 4) will be reduced or eliminated. Further, by multiplying the frequency of the TX VCO 416 by, in this example, a factor of two, any radiation from the TX VCO 416 occurs outside of the transmit frequency, and has negligible effect on the input signal to the power control element 145.

In operation, when the level of the control voltage $V_{APC}$ on connection 552 exceeds the level of the reference voltage on connection 554, current is caused to flow through the tuned output circuit 530 and lowers the current flowing to the output terminal 159. Conversely, when the level of the control voltage $V_{APC}$ on connection 552 is lower than the level of the reference voltage on connection 554, current is caused to bypass the tuned output circuit 530 and increases the current flowing to the output terminal 159. In this manner, under low power output operating conditions, the apparent isolation between the input of the power amplifier 160 on connection 157 (FIG. 4) and the input to the power control element 145 on connection 170 (FIG. 4) is maximized. For example, under low power conditions, using $V_{APC}$ to control the variable gain frequency multiplier 500 so that there is approximately −15 dBm on connection 159 and −63 dBm on connection 170, improves the apparent isolation by approximately 28dB. This can be thought of as controlling the "dynamic isolation." In other words, by using the variable gain frequency multiplier 500 to control power to approximately −15 dBm at the connection 159, the existing on-chip static isolation is sufficient to prevent the unwanted coupling from connection 157 to connection 170 to overshadow the feedback signal on connection 170, which is an attenuated version of the output power of the power amplifier.

In the example described above, at low input power (i.e., when the $V_{APC}$ signal is relatively low compared to the reference voltage signal $V_{REF}$), the output of the variable gain frequency multiplier 500 is on the order of −10 to −15 dBm. In synchronicity with the output of the power amplifier, the output of the variable gain frequency multiplier 500 is ramped up (or down). The maximum output power of the variable gain frequency multiplier 500 is on the order of +5 dBm and the output power of the power amplifier is on the order of +30 dBm. The dynamic variation of the output power of the variable gain frequency multiplier 500 combined with the operation of the variable gain frequency multiplier 500 at two times (2×) the LO frequency, improves the dynamic isolation of the system by an amount equal to the control range of the gain of the variable gain frequency multiplier 500.

Figure 6:
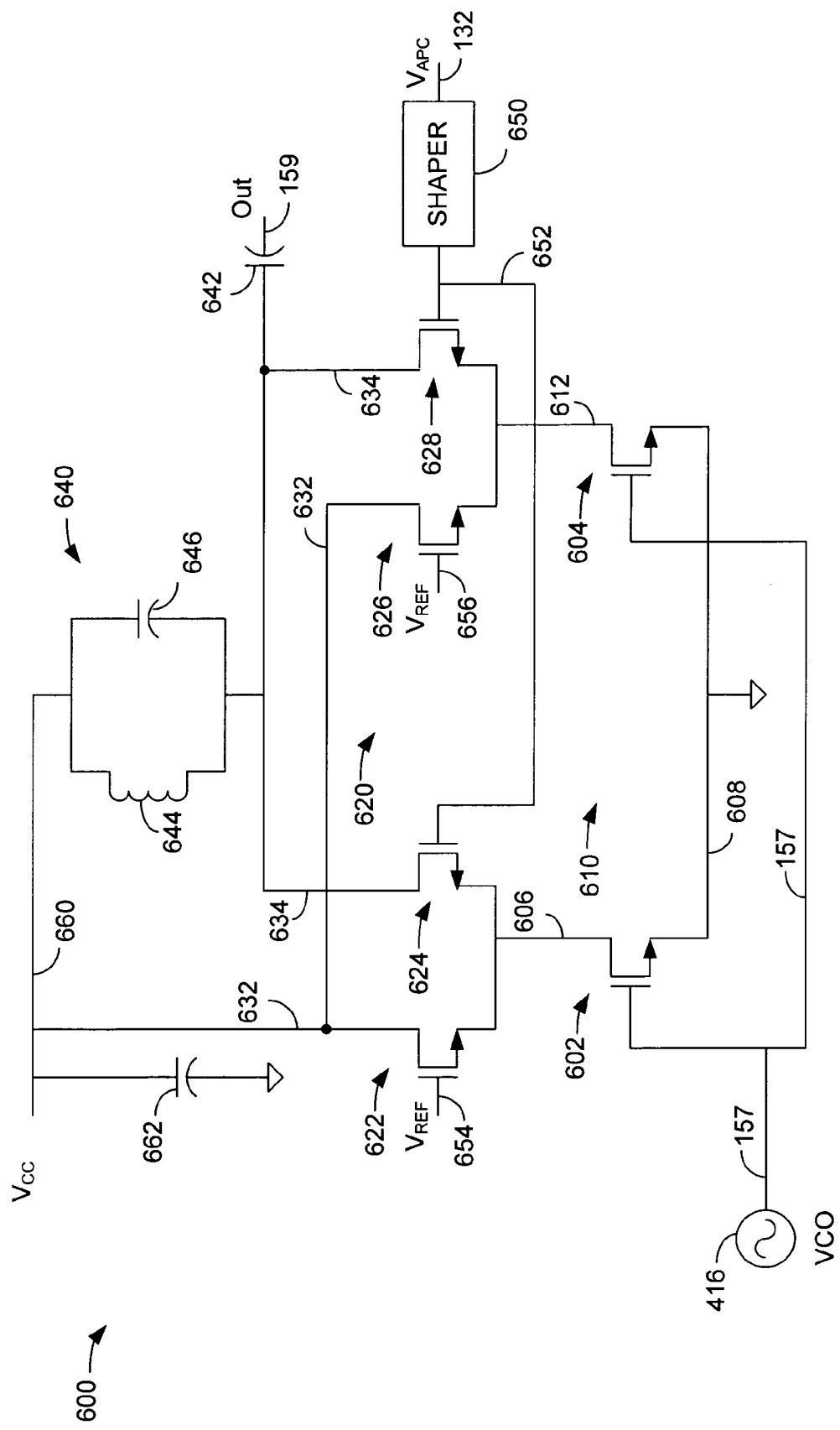
FIG. 6 is a schematic diagram illustrating an alternative embodiment of the variable gain frequency multiplier of FIG. 4.

FIG. 6 is a schematic diagram illustrating an alternative embodiment of the variable gain frequency multiplier of FIG. 4. The variable gain frequency multiplier 600 comprises a multiplier circuit 610, a control circuit 620 and a tuned output circuit, also referred to as a "tank" circuit 640. The tuned output circuit 640 is similar to the tuned output circuit 530 of FIG. 5. The multiplier circuit 610 comprises, in this example, a pair of transistors 602 and 604. In this example, the transistors 602 and 604 are field effect transistors, but other transistor designs are possible. The TX VCO 416 supplies, in this example, an approximate 1 gigahertz (GHz) alternating voltage signal via connection 157 to the gate terminals of the transistors 602 and 604. In this manner, the transistors 602 and 604 rectify and multiply the input signal from the TX VCO 416 to provide a nominal 2 GHz signal on connections 606 and 612, with one component present on connection 606 and another component present on connection 612.

The signal on connections 606 and 612 is supplied to the control circuit 620.

The control circuit 620 comprises a pair of transistors 622 and 624 and a pair of transistors 626 and 628. The transistors 622, 624, 626 and 628 are similar to the transistors 602 and 604 discussed previously. The $V_{APC}$ signal on connection 132 is supplied to a shaping circuit 650, which is similar to the shaping circuit 550 described above. The output of the shaping circuit 650 is supplied via connection 652 to the gate terminal of the transistor 628 and via connection 652 to the gate terminal of the transistor 624. The shaping circuit 650 receives as input a signal that is generated based on the ratio of the output power of the power amplifier 160 with respect to the control signal $V_{APC}$, which will be described below in FIG. 7.

The drain terminal of the transistor 624 and the drain terminal of the transistor 628 are coupled to the tuned output circuit 640 and to the output terminal 159 via a capacitor 642. The drain terminal of the transistor 622 and the drain terminal of the transistor 626 are coupled directly to system voltage $V_{CC}$ via connection 638. The tuned output circuit 640 comprises an inductor 644 and a capacitor 646, and is also coupled to system voltage $V_{CC}$ via connection 660. However, radio frequency radiation from the output circuit 640 is likely to leak into the input 170 of the power control element 145 (FIG. 4). Therefore, in accordance with an embodiment of the invention, at low power levels, when leakage from the output circuit 640 is likely to cause significant disturbance to the power control element 145, the signal current at connections 606 and 612, which is the output of the multiplier 610 in FIG. 6, bypasses the tuned output circuit 640 and is connected to the voltage supply 660 through transistors 622 and 626. At low power levels (corresponding to a low $V_{APC}$ value on connection 132), the output voltage swing at node 634 will be reduced. In this manner, unwanted RF coupling to the mixer 426 (FIG. 4) is reduced or eliminated. Further, by multiplying the frequency of the TX VCO 416 by, in this example, a factor of two, any radiation form the TX VCO 416 occurs outside of the transmit frequency, and has negligible effect on the input signal to the power control element 145.

In operation, when the level of the control voltage $V_{APC}$ on connection 652 exceeds the level of the reference voltage on connections 654 and 656, current is caused to flow through the tuned output circuit 640 and lowers the current flowing to the output terminal 159. Conversely, when the level of the control voltage $V_{APC}$ on connection 652 is lower than the level of the reference voltage on connections 654 and 656, current is caused to bypass the output circuit 640 and increases the current flowing to the output terminal 159. In this manner, under low power output operating conditions, the apparent isolation between the input of the power amplifier 160 on connection 158 (FIG. 4) and the input to the power control element 145 on connection 170 (FIG. 4) is maximized. For example, under low power conditions, using $V_{APC}$ to control the variable gain frequency multiplier 600 so that there is approximately −15 dBm on connection 159 and −63 dBm on connection 170, improves the apparent isolation by approximately 28 dB. This can be thought of as controlling the "dynamic isolation." In other words, by using the variable gain frequency multiplier 600 to control power to approximately −15 dBm at the connection 159, the existing on-chip static isolation is sufficient to prevent the unwanted coupling from connection 157 to connection 170 to overshadow the feedback signal on connection 170, which is an attenuated version of the power amplifier at node 170 in FIG. 4.

In the example described above, at low input power (i.e., when the $V_{APC}$ signal is relatively low), the output of the variable gain frequency multiplier 600 is on the order of −10 to −15 dBm. In synchronicity with the output of the power amplifier, the output of the variable gain frequency multiplier 600 is ramped up (or down). The maximum output power of the variable gain frequency multiplier 600 is on the order of +5 dBm and the output power off the power amplifier is on the order of +30 dBm. The dynamic variation of the variable gain frequency multiplier 600 output power combined with the operation of the variable gain frequency multiplier 600 at two times (2×) the LO frequency, improves the dynamic isolation of the system by an amount equal to the control range of the gain of the variable gain frequency multiplier 600.

Figure 7:
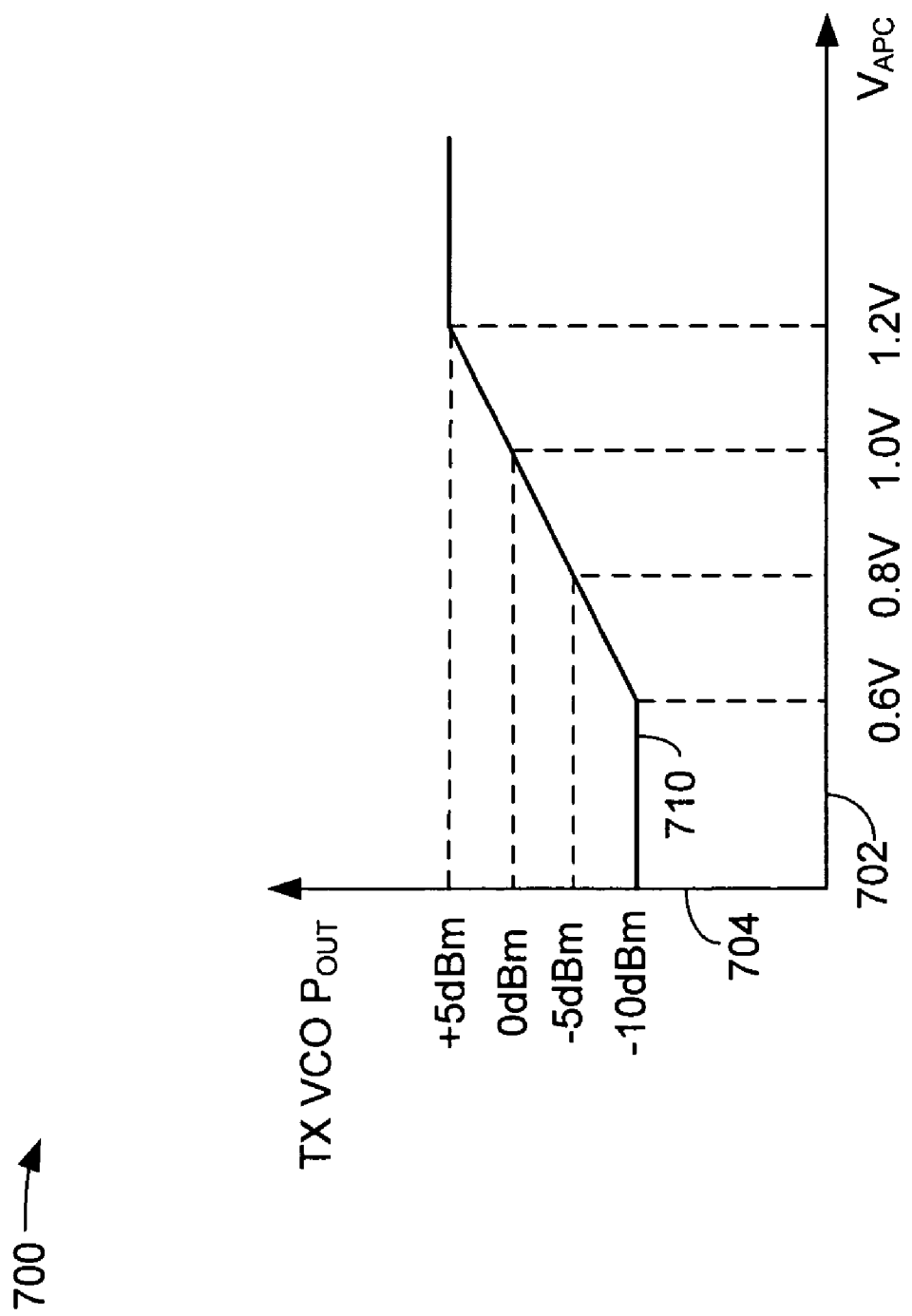
FIG. 7 is a diagram illustrating the control function used to control the variable gain frequency multiplier.

FIG. 7 is a diagram 700 illustrating the control function used to control the variable gain frequency multiplier. The horizontal axis 702 represents the control voltage $V_{APC}$ and the vertical axis 704 represents the output power ($P_{OUT}$) of the TX VCO 416. The curve 710 represents the function that is supplied to the shaping circuit 550 (FIG. 5) and the shaping circuit 650 (FIG. 6) that represents the control voltage $V_{APC}$ and that is used to control the operation of the control circuit 520 (FIG. 5) and the control circuit 620 (FIG. 6) described above. In the example shown, a $V_{APC}$ voltage of 0.6V corresponds to a TX VCO output power of −10 dBm and also corresponds to a power amplifier output of −15 dBm. As the $V_{APC}$ voltage increases, the power output of the TX VCO 416 increases, as does the power output of the power amplifier. A $V_{APC}$ voltage of 0.8V corresponds to a TX VCO output power of −5 dBm and also corresponds to a power amplifier output of −6 dBm, a $V_{APC}$ voltage of 1.0V corresponds to a TX VCO output power of 0 dBm and also corresponds to a power amplifier output of +2 dBm, and a $V_{APC}$ voltage of 1.2V corresponds to a TX VCO output power of +5 dBm and also corresponds to a power amplifier output of +10 dBm. However, the values shown in FIG. 7 are for illustrative purposes only. The values are chosen based on desired system operating parameters.

Figure 8:
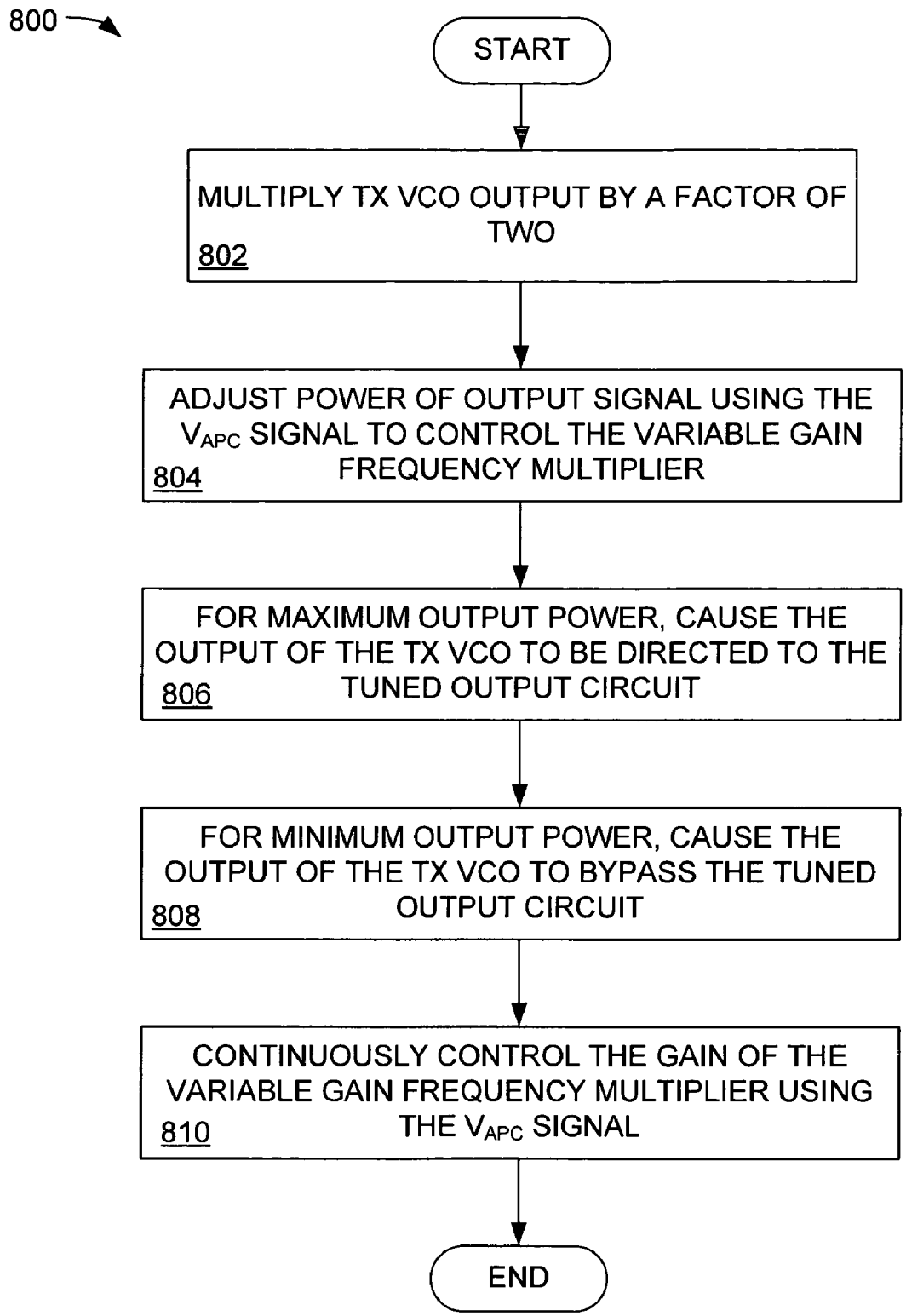
FIG. 8 is a flowchart describing the operation of an embodiment of the variable gain frequency multiplier described above.

FIG. 8 is a flowchart 800 describing the operation of an embodiment of the variable gain frequency multiplier described above. The blocks in the flowchart may be performed in the order shown out of the order shown, or substantially in parallel. In block 802, the output of the TX VCO 416 is multiplied by a nominal factor of two (2×) by the transistors 502 and 504 (FIG. 5) and by the transistors 602 and 604 (FIG. 6). In block 804, the power output of the power amplifier is adjusted by adjusting the gain of the variable gain frequency multiplier 500 (FIG. 4) based on the level of the $V_{APC}$ signal.

In block 806, to change the power of the output signal for the maximum output power condition, the current output of the TX VCO 416 is directed though the tuned output circuit (530 in FIG. 5 and 640 in FIG. 6). This is done by supplying the shaped $V_{APC}$ signal to the control circuit 520 (FIG. 5) and 620 (FIG. 6). In block 808, to change the power of the output signal for the minimum output power condition, the current output of the TX VCO 416 is caused to bypass the tuned output circuit (530 in FIG. 5 and 640 in FIG. 6) and is directed through the transistor 524 (FIG. 5) and 622/632 (FIG. 6) to $V_{CC}$ so that less current is directed to the input of the power amplifier under minimum power conditions. The transistors 524 (FIG. 5) and the transistors 622/632 (FIG. 6) can be referred to as bypass elements.

In block 810, the gain control of the variable gain frequency multiplier 500 is done by continuously steering the current output of the TX VCO 416 from a maximum (mainly though the tuned output circuit) to a minimum (mainly though the bypass element) as a function of the output power of the power amplifier.

The on-chip isolation at the frequency of 2× the TX VCO frequency improves because the actual RF power which is generated on-chip is equal to the current multiplied by the load impedance. In the case of maximum output power, the tuned output circuit (530/640) provides relatively high impedance. In one implementation example, the tuned output circuit (530/640) provides about 200 ohm at 2 GHz. In the case of low output power, the power supply ($V_{CC}$) provides very low impedance (with the bypass capacitors 540 (FIG. 5) and 662 (FIG. 6)) on the order of single digits of ohms.

When the TX VCO 416 is centered on—frequency it is difficult to achieve a stable operation across the wide output power range. In the example shown, it means that at low output power the actual power from the variable gain frequency multiplier 500 is being wasted. However, for system stability, it is very important to maintain stable operating conditions for the multiplier 510 (FIG. 5) and 610 (FIG. 6) connected to the TX VCO 416 for the entire control range. Otherwise, the input referred impedance (reactance) of the multiplier 510 (FIG. 5) and 610 (FIG. 6) will change, thus affecting the operating frequency of the TX VCO 416. If the frequency variation is substantial the PLL may go out of lock completely or the system may suffer from significant frequency transients.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A variable gain frequency multiplier for a radio frequency transmitter circuit, comprising:
  a frequency multiplier circuit; and
  a control circuit coupled to an output of the frequency multiplier circuit and configured to receive a transmitter power control signal, the transmitter power control signal being proportional to a transmitter power output signal; and
  a tuned output circuit, where at a power level below a specified threshold, the control circuit varies gain by causing the output of the frequency multiplier circuit to bypass the tuned output circuit.

2. The variable gain frequency multiplier of claim 1, in which at a power level above the threshold, the output of the frequency multiplier circuit passes through the tuned output circuit.

3. The variable gain frequency multiplier of claim 2, in which the control circuit further comprises:
a first transistor configured to receive a reference signal; and
a second transistor configured to receive the power control signal.

4. The variable gain frequency multiplier of claim 2, in which the control circuit further comprises:
a first differential pair and a second differential pair, in which each differential pair comprises a first transistor configured to receive a reference signal and a second transistor configured to receive the power control signal.

5. The variable gain frequency multiplier of claim 2, further comprising:
a power amplifier; and
a closed power control loop, and in which bypassing the tuned output circuit isolates an input of the power amplifier from an input of the power control loop.

6. The variable gain frequency multiplier of claim 1, in which the power control signal causes the control circuit to ramp the gain of the variable gain frequency multiplier in accordance with the power output signal.

7. A method for controlling the frequency and gain of a transmit signal, comprising:
providing an oscillator signal to a frequency multiplier circuit;
providing an output of the frequency multiplier circuit and a transmitter power control signal to a control circuit, wherein the transmitter power control signal is proportional to a transmitter power output signal; and
using the power control signal to determine a gain of the output of the frequency multiplier circuit; and
determining the gain of the output of the frequency multiplier circuit by causing the output of the frequency multiplier circuit to bypass a tuned output circuit when the transmitter power control signal is below a specified threshold.

8. The method of claim 7, further comprising determining the gain of the output of the frequency multiplier circuit by causing the output of the frequency multiplier circuit to flow through the tuned output circuit when the power control signal is above a specified threshold.

9. The method of claim 8, further comprising:
receiving a reference signal in a first transistor; and
receiving the power control signal in a second transistor.

10. The method of claim 8, further comprising:
receiving a reference signal in a first transistor of a differential pair; and
receiving the power control signal in a second transistor of a differential pair.

11. The method of claim 8, in which bypassing the tuned output circuit isolates an input of a power amplifier from an input of a power control loop.

12. The method of claim 7, in which the power control signal causes the control circuit to ramp the gain of the variable gain frequency multiplier in accordance with the power output signal.

13. A portable transceiver having a variable gain frequency multiplier, comprising:
a fully differential receive chain;
a subharmonic mixer in the receive chain, the subharmonic mixer configured to receive a radio frequency (RF) input signal and a local oscillator (LO) signal that is phase-shifted by a nominal 45 degrees;
a synthesizer having a voltage controlled oscillator and having at least one frequency divider to generate desired transmit and receive LO signals;
a transmitter having a closed power control loop;
a harmonic rejection modulator, the use thereof made possible by a frequency plan designed to allow the synthesizer to develop the transmit and receive LO signals without a frequency multiplier; and
a variable gain frequency multiplier comprising:
a frequency multiplier circuit; and
a control circuit coupled to the frequency multiplier circuit and configured to receive a transmitter power control signal, the transmitter power control signal being proportional to a transmitter power output signal; and
a tuned output circuit, where at a power level below a specified threshold, an output of the freciuency multiplier circuit bypasses the tuned output circuit.

14. The portable transceiver of claim 13, in which at a power level above the threshold, the output of the frequency multiplier circuit passes through the tuned output circuit.

15. The portable transceiver of claim 14, in which the control circuit further comprises:
a first transistor configured to receive a reference signal; and
a second transistor configured to receive the power control signal.

16. The portable transceiver of claim 14, in which the control circuit further comprises:
a first differential pair and a second differential pair, in which each differential pair comprises a first transistor configured to receive a reference signal and a second transistor configured to receive the power control signal.

17. The portable transceiver of claim 14, further comprising:
a power amplifier; and
a closed power control loop, and in which bypassing the tuned output circuit isolates an input of the power amplifier from an input of the power control loop.

* * * * *